United States Patent [19]
Yin et al.

[11] Patent Number: 5,670,398
[45] Date of Patent: Sep. 23, 1997

[54] METHOD OF MANUFACTURING THIN FILM TRANSISTOR HAVING A DOUBLE CHANNEL

[75] Inventors: Sung Wook Yin; Yun Ki Kim, both of Kyoungkido, Rep. of Korea

[73] Assignee: Hyundai Electronics Industries Co., Ltd., Kyoungkido, Rep. of Korea

[21] Appl. No.: 559,880

[22] Filed: Nov. 20, 1995

[30]  Foreign Application Priority Data

Dec. 26, 1994 [KR]  Rep. of Korea ............... 1994-36936

[51] Int. Cl.⁶ ................................................ H01L 21/265
[52] U.S. Cl. ........................... 437/40 TFT; 437/191; 437/203
[58] Field of Search ................. 437/40 TFT, 41 TFT, 437/67, 191, 203; 148/DIG. 50

[56] References Cited

U.S. PATENT DOCUMENTS

| | | | |
|---|---|---|---|
| 5,298,782 | 3/1994 | Sundaresan | 437/191 |
| 5,348,899 | 9/1994 | Dennison et al. | 437/41 |
| 5,362,669 | 11/1994 | Boyd et al. | 437/67 |
| 5,372,959 | 12/1994 | Chan | 437/41 |

*Primary Examiner*—Chandra Chaudhari
*Attorney, Agent, or Firm*—Jacobson, Price, Holman & Stern, PLLC

[57]  ABSTRACT

This invention provides a method for manufacturing a thin film transistor which comprised the steps of providing an oxide layer; etching a portion of the oxide layer so that a recess is formed; forming a first channel layer on the resulting structure; forming a first gate oxide layer on the first channel layer in a portion including the recess region; forming a polysilicon layer on the resulting structure, filling in the recess region; etching back the polysilicon layer until the surface of a portion of the first gate oxide layer, leaving the residual layer on the first channel layer, which is exposed by the first gate oxide layer, wherein the surface of the resulting structure has uniform topology by the etching process; forming a second gate oxide layer on the polysilicon layer; forming a second channel layer on the resulting structure; and implanting impurity ions for forming source/drain regions, whereby the source/drain region consists of multi-layers, the first channel layer, the second polysilicon layer and the second channel layer.

2 Claims, 4 Drawing Sheets

5,670,398

METHOD OF MANUFACTURING THIN FILM TRANSISTOR HAVING A DOUBLE CHANNEL

FIELD OF THE INVENTION

This invention relates to a thin film transistor used in a highly integrated circuit (or SRAM) and its manufacturing method, and more particularly, to a thin film transistor having a double channel.

BACKGROUND OF THE INVENTION

Generally, a channel of a thin film transistor (hereinafter, referred to as TFT) has been made of a polysilicon layer. One transistor consists of only one channel. This conventional TFT has been formed by two methods, one of which is the top gate process, and the other of which is the bottom gate process.

A TFT formed by the bottom gate process will be described below.

First, a polysilicon layer for a TFT's gate electrode is formed on an oxide layer, and the polysilicon layer is patterned in a predetermined size. A thin oxide layer is formed on the polysilicon layer for making a gate oxide layer. For forming a channel of the transistor, a thin polysilicon layer is formed on the gate oxide layer. Source/drain regions are formed by implanting impurity ions into a predetermined region of the thin polysilicon layer. Accordingly, a region, which is not implanted by the impurity ions, is the channel.

Furthermore, the impurity implantation relative to the TFT is classified into two methods. The first is a source/drain ion implantation in which impurity ions are implanted into predetermined regions of the thin polysilicon layer, which forms the TFT's channel, in order to improve the on-current. The second is a lightly drain offset implantation in which impurity ions are implanted into a offset region of the drain region.

As stated above, since the on-current associated with electric features of the conventional thin film transistors depends upon the impurity ion implantation, and the channel and the source/drain regions are formed in the same polysilicon layer, the conventional TFT's sets limits to increasing the on-current.

Also, the conventional top gate process has a problem in that a bridge is created between the polysilicon layers for the channel by the etched residual caused by topology generated when the gate electrode is patterned.

SUMMARY OF THE INVENTION

To overcome the above problems, an object of this invention is to provide a thin film transistor and its manufacturing method for increasing on-current thereof.

In accordance with an aspect of this invention, there is provided a thin film transistor comprising: an insulating layer having a recess; a first channel layer formed on the insulating layer; a first gate oxide layer formed on the first channel layer in a portion including the recess region; a first polysilicon layer for a gate electrode filling in the recess region on the first gate oxide layer; a second polysilicon layer formed on the first channel layer, wherein the upper surface of the resulting structure made of the first and second polysilicon layers and the first gate oxide layer has uniform topology; a second gate oxide layer formed on the first polysilicon layer; and a second channel layer formed on the resulting structure, electrically being connected with the second polysilicon layer, whereby the source/drain regions consists of multi-layers, the first channel layer, the second polysilicon layer and the second channel layer.

In accordance with another aspect of this invention, there is provided a method for manufacturing a thin film transistor comprising the steps of: providing an oxide layer; etching a portion of the oxide layer so that a recess is formed; forming a first channel layer on the resulting structure; forming a first gate oxide layer on the first channel layer in a portion including the recess region; forming a polysilicon layer on the resulting structure, filling in the recess region; etching back the polysilicon layer until the surface of a portion of the first gate oxide layer, leaving the residual layer on the first channel layer, which is exposed by the first gate oxide layer, wherein the surface of the resulting structure has uniform topology by the etching process; forming a second gate oxide layer on the polysilicon layer; forming a second channel layer on the resulting structure; and implanting impurity ions for forming source/drain regions, whereby the source/drain region consists of multi-layers, the first channel layer, the second polysilicon layer and the second channel layer.

BRIEF DESCRIPTION OF THE DRAWINGS

The above and other aspects and advantages of the present invention are described in conjunction with the following drawing figures, in which.

DETAILED DESCRIPTION OF THE INVENTION

Hereinafter, this invention will be described referring to FIGS. 1A through 1F.

FIGS. 1A through 1F show the processes for manufacturing a thin film transistor, which is used in a SRAM, having a double channel in accordance with an embodiment of this invention.

Figure 1A:
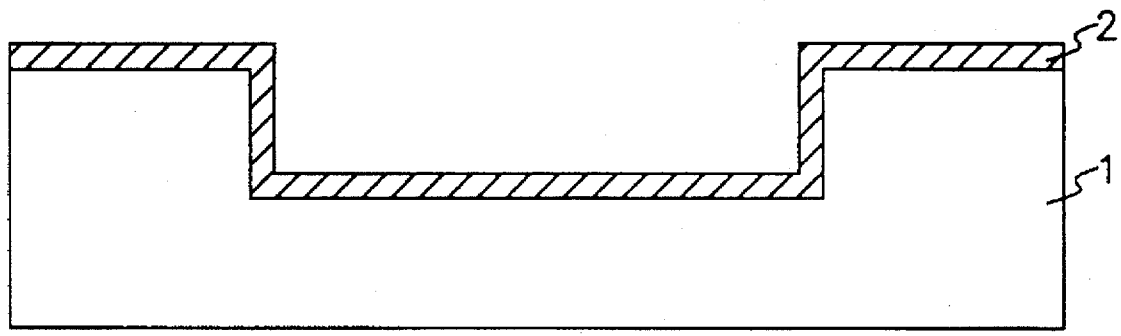
FIGS. 1A through 1F are cross-sectional views illustrating the steps of manufacturing the thin film transistor having a double channel according to this invention.

First, as shown in FIG. 1A, there is provided an oxide layer 1 whose a portion is etched, and a polysilicon layer 2 is formed on the oxide layer 1 in order to form a channel on the thin film transistor. Here, etching the oxide layer 1 prevents the creation of topology caused by a gate electrode.

Figure 1B:
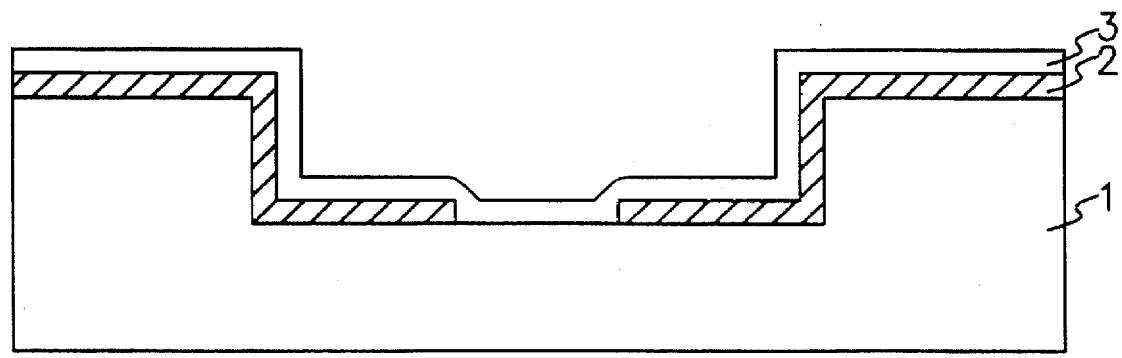

Referring now to FIG. 1B, a part of the polysilicon layer 2, which is on the etched region of the oxide layer 1, is removed, and a gate oxide layer 3 is formed on the resulting structure.

Figure 1C:
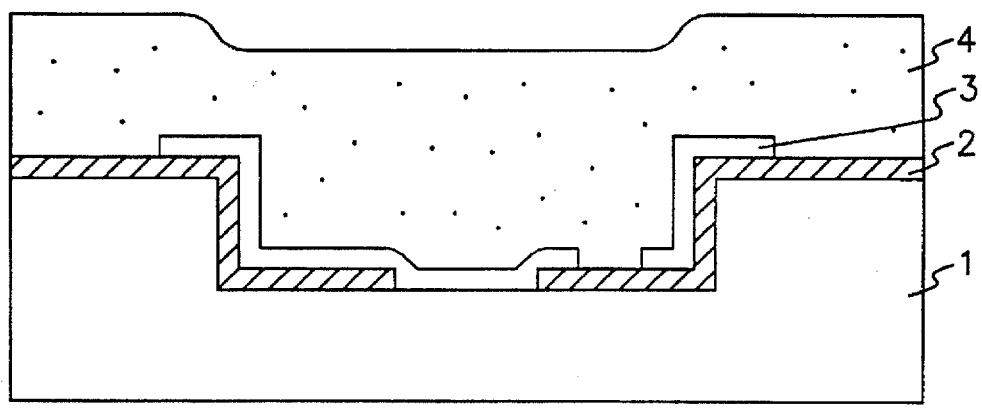

The gate oxide layer 3 is patterned, and a polysilicon layer 4, for a gate electrode, is formed on the resulting structure, as shown FIG. 1C. At the time of patterning the gate oxide layer 3, the removed portion of the gate oxide layer 3 can be used as a load contact in case of an SRAM cell.

Figure 1D:
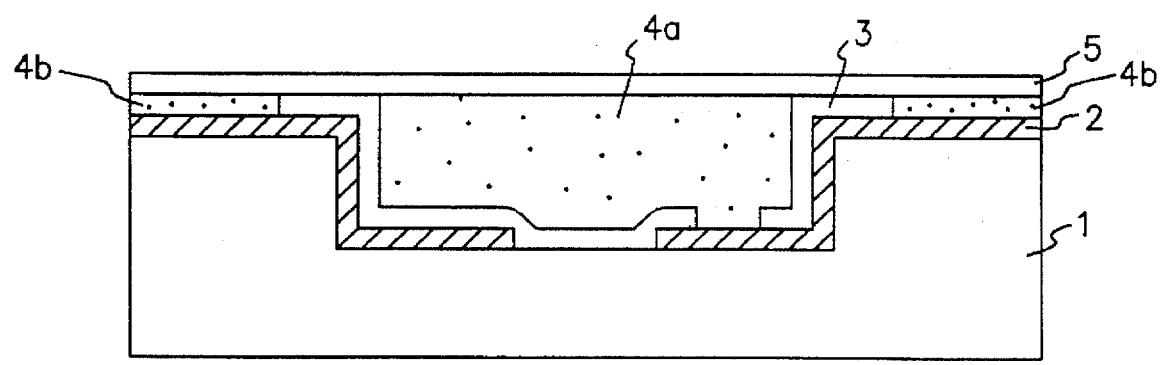

As shown in FIG. 1D, the polysilicon layer 4 is etched back until the surface of a portion of the gate oxide layer 3 is exposed, and a gate oxide layer 5 is formed on the resulting structure. At this time, polysilicon layers 4a and 4b is formed by the etching process on the polysilicon layer 4. The polysilicon layer 4a, formed in the recess, is used for a gate electrode, and the polysilicon layers 4b is used for source/drain electrodes.

Also, we note that, in FIG. 1D, a planarization process is applied to the upper surface of the resulting structure using the etch back process.

Figure 1E:
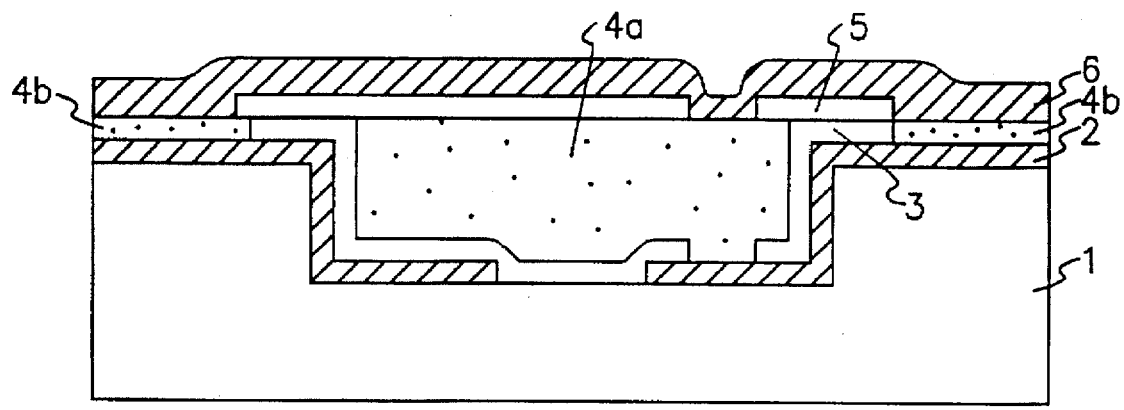

Next, as shown in FIG. 1E, portions of the gate oxide layer 5 are removed so that portions of the polysilicon layers 4a and 4b are exposed, and a polysilicon layer 6, for another channel, is formed on the resulting structure.

Finally, the polysilicon layer 6 is patterned using a photomask which has been used for patterning the polysilicon layer 2 in FIG. 1B.

Figure 1F:
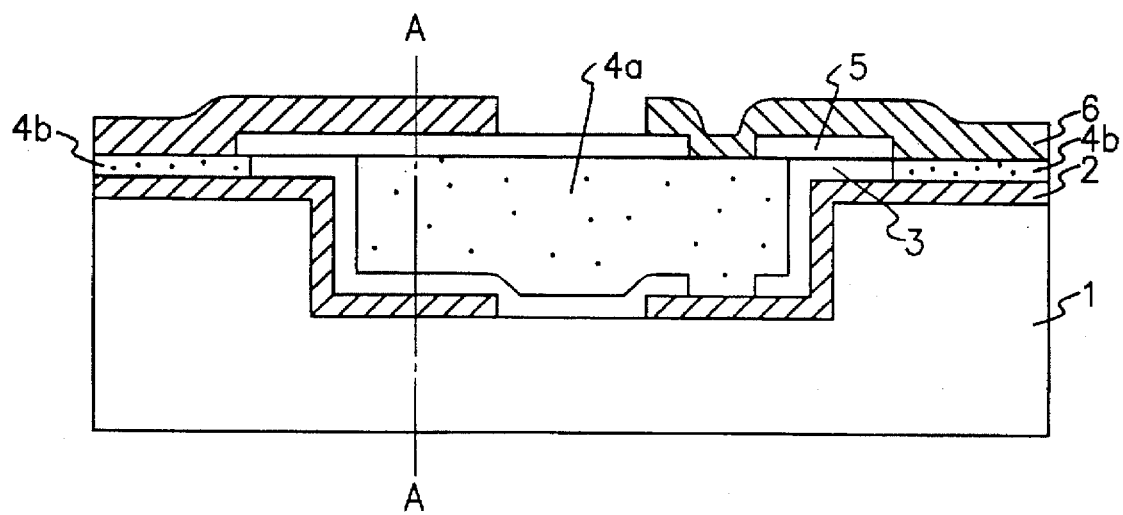
Figure 2:
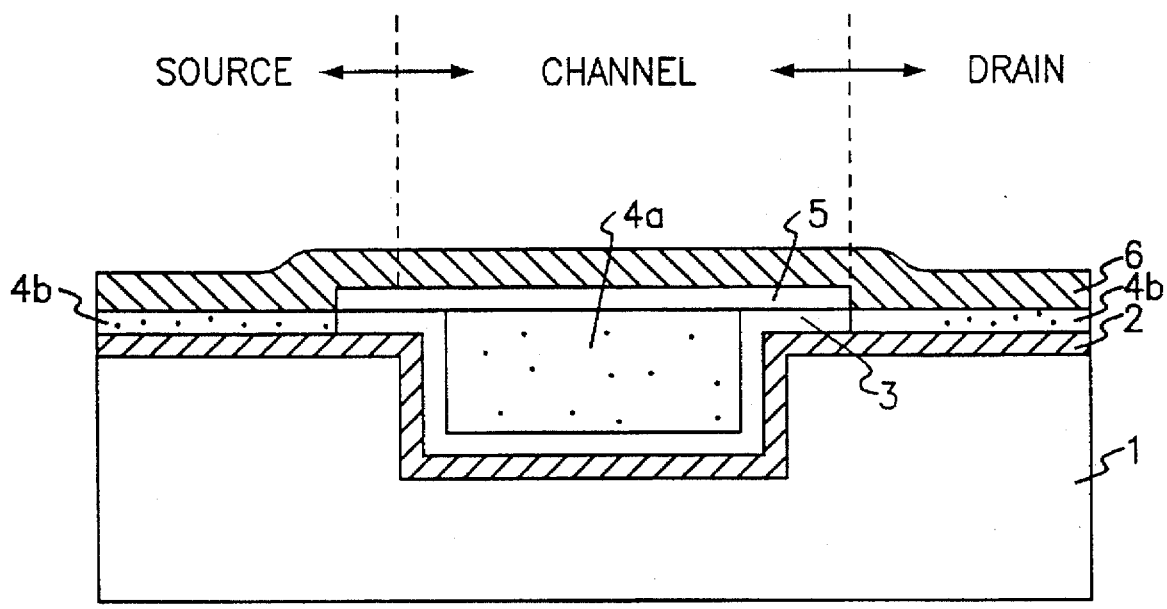
FIG. 2 is a cross-sectional view taken according to the broken line A—A' in FIG. 1F.

Furthermore, FIG. 2 taken according to broken line A—A' in FIG. 1F clearly shows the structure according to this invention, regardless of the node contact of a SRAM. As shown in FIG. 2, the conductive layer is thickly formed by multi-layers, the polysilicon layers 2, 4b and 6. Also, the gate oxide layers 3 and 5 are formed on the upper and lower portion of the gate electrode 4a, and two channels are formed by the polysilicon layers 2 and 6. Furthermore, to increase the on-current, the source/drain ion implantation and the lightly drain offset ion implantation can be used.

As illustrated above, the transistor according to this invention has the double channel and thick source/drain electrode, thereby improving the electric feature of the TFTs and increasing the on-current, having simplification of the processes by removing topology.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a thin film transistor having double channels comprising the steps of:

providing an oxide layer;

etching a portion of the oxide layer so that a recess is formed;

forming a first channel layer on the resulting structure;

forming a first gate oxide layer on the first channel layer in a portion including the recess region;

forming a polysilicon layer on the resulting structure, filling in the recess region;

etching back the polysilicon layer until the surface of a portion of the first gate oxide layer, leaving the residual layer on the first channel layer, which is exposed by the first gate oxide layer, wherein the surface of the resulting structure has uniform topology by the etching process;

forming a second gate oxide layer on the polysilicon layer;

forming a second channel layer on the resulting structure; and implanting impurity ions for forming source/drain regions, whereby the source/drain region consists of multi-layers, which consists of the first channel layer, the second polysilicon layer and the second channel layer.

2. A method according to claim 1, wherein the first and second channel layer are polysilicon layers.

* * * * *